United States Patent [19]

Cook, Jr.

[11] 4,005,452
[45] Jan. 25, 1977

[54] METHOD FOR PROVIDING ELECTRICAL ISOLATING MATERIAL IN SELECTED REGIONS OF A SEMICONDUCTIVE MATERIAL AND THE PRODUCT PRODUCED THEREBY

[75] Inventor: Charles R. Cook, Jr., North Palm Beach, Fla.

[73] Assignee: International Telephone and Telegraph Corporation, Nutley, N.J.

[22] Filed: Nov. 15, 1974

[21] Appl. No.: 524,296

[52] U.S. Cl. .................................. 357/49; 29/578
[51] Int. Cl.² ........................................ H01L 27/12
[58] Field of Search ................ 357/49, 50; 204/15; 29/578

[56] References Cited

UNITED STATES PATENTS

| 3,341,743 | 9/1967 | Ramsey | 357/49 |
| 3,354,360 | 11/1967 | Campagna et al. | 357/50 |
| 3,386,865 | 6/1968 | Doo | 357/50 |
| 3,640,806 | 2/1972 | Watanabe et al. | 357/50 |
| 3,723,258 | 3/1973 | Podell et al. | 204/15 |
| 3,737,701 | 6/1973 | Hoeberechts | 357/49 |
| 3,797,102 | 3/1974 | Huffman | 357/49 |
| 3,827,949 | 8/1974 | Platter et al. | 204/15 |

OTHER PUBLICATIONS

Isolation Techniques for Ge Integrated Circuits by Light et al., IBM Tech. Discl. Bulletin vol. 9, No. 10 3/67 p. 1448.

"An Integration Approach for GE" by Light et al., IBM Tech Discl Bulletin vol. 9, No. 10 Mar. 67, pp. 1446-1447.

*Primary Examiner*—Harold A. Dixon
*Attorney, Agent, or Firm*—John T. O'Halloran; Peter C. Van Der Sluys

[57] ABSTRACT

An integrated circuit having dielectric isolation is fabricated by growing a double epitaxial layer of N-type semiconductive material onto a P-type substrate. A dielectric layer is formed over the epitaxial layer and thereafter the dielectric and the epitaxial growth are removed in selected isolation regions to expose the substrate. A metal layer is evaporated onto the device so that metal is deposited both on the exposed substrate material and on the dielectric layer. A dielectric is formed by selectively anodizing the metal deposited on the exposed substrate to provide electrical isolation between the remaining portions of the epitaxial growth. Because of the electrical insulating characteristics of the dielectric layer, the metal deposited on the dielectric layer is not anodized and may be removed using a compound that attacks the unanodized metal and has little effect on the anodized metal. Base and emitter elements are formed in the conventional manner to complete the integrated circuit.

37 Claims, 21 Drawing Figures

METHOD FOR PROVIDING ELECTRICAL ISOLATING MATERIAL IN SELECTED REGIONS OF A SEMICONDUCTIVE MATERIAL AND THE PRODUCT PRODUCED THEREBY

BACKGROUND OF THE INVENTION

1. Field of the Invention

This invention relates generally to a method for providing electrical insulating material in selected regions of a semiconductive material and more particularly to a method for fabricatng an integrated circuit having electrical isolation between functional elements thereof.

2. Description of the Prior Art

Heretofore a number of methods have been used to provide isolation between functional elements in integrated circuit device; however, most of these have proven to be either ineffective or impractical due to high cost.

A first isolating method provided isolation using back to back PN junctions. The junctions were formed by diffusing P-type impurites into an N-type epitaxial layer until the P-type diffusion extended through the entire epitaxial layer to a P-type substrate. In order to achieve high saturation currents, a layer of high concentration N-type impurity is usually formed by diffusion prior to growing the epitaxial layer. Since it is difficult to diffuse sufficient P-type impurities through the epitaxial layer to overcome the high concentration of N-type, it was essential that a mask be used during the diffusion of the N-type impurities so that the high concentration was not present in the regions where P-type impurities were to be diffused. Thus, two diffusion steps were required, each step requiring a separate mask. The need for two masks and two high temperature diffusion steps increased the cost of the fabricated device and also degraded the semiconductor material.

In an attempt to eliminate a masking opertion and one of the high temperature diffusion steps, a double epitaxial layer of N-type semiconductivity was formed on a P-type substrate. A first layer had a high N-type impurity concentration and the second layer a standard N-type impurity concentration. The isolation was provided by P-type diffusion through the double epitaxial layer to the P-type substrate to form PN junctions; however, it was difficult to properly diffuse P-type impurities through the high n-type impurity concentration in the first epitaxial layer. As a result, the P-type diffusion step had to extend over periods of time that proved impractical.

In a third method for providing isolation, the silicon in the isolating region was partially etched and thereafter oxidized to form a dielectric silicon dioxide; however, it was discovered that in order to provide the proper thickness of silicon dioxide, an oxidation period of approximately 10 hours at 1,000° C was required and this proved to be both time consuming and detrimental to the semiconductor material.

Another method of providing isolation required the formation of channels or valleys in a single crystal semiconductor material. A layer of polycrystalline silicon was then formed over the channels. The single crystal silicon was lapped off to expose isolating regions of polycrystalline silicon which formed a substrate having isolated regions of single crystal silicon which formed the active elements of the circuit. This lapping process proved to be extremely expensive and time consuming and did not provide a satisfactory solution to the isolation requirement.

Thus, all the prior art methods suffered from some deficiency. The methods were either time consuming, too expensive or degraded the semiconductor material due to excessive exposure to extreme temperatures.

SUMMARY OF THE INVENTION

The present invention contemplates the use of an anodized metal for providing electrical isolation between functional elements in an integrated circuit. The use of an anodized metal, which is a dielectric material, eliminates the difficulties encountered with PN junction isolation techniques and the resulting capacitance formed across the junction. An anodized metal dielectric provides satisfactory isolation; however, difficulties were experienced in providing an anodic film thick enough to completely isolate the functional elements. It was discovered that when aluminum was anodized in the proper type of electrolyte, a porous anodic film was developed. Because of the porosity, the film could be developed to the thickness required for isolation purposes. Thus, anodic film provides a dielectric for isolating the functional elements.

The dielectric is only desired in the selected isolating regions; therefore, the dielectric had to be removed from the other areas or a masking step was required to prevent its formation in the undesired areas. The present invention solves this problem by selectively anodizing the metal. Once the metal is selectively anodized, removal of the unanodized metal is accomplished using compounds that will attach pure metal while having very little effect on the anodized metal. Thus, it is possible to remove unanodized metal without the need for a polishing or lapping step as required in the prior art where dielectrics were used for isolation.

A double epitaxial layer of N-type semiconductivity material is grown onto a P-type substrate, one of said epitaxial layers adjacent the P-type substrate has a high concentration of N-type impurities to provide collector elements with low resistance. The outer surface of the epitaxial layer is oxidized to form a protective dielectric layer of oxide. The oxide layer and epitaxial layer etched away in selected isolation regions between the collector elements to expose a portion of the P-type substrate. Thereafter, aluminum is evaporated onto the surface said evaporation being conducted at a low temperature so that no degradation of the semiconductor material is experienced. The preferred thickness of aluminum to be evaporated is equal to 2/3 the thickness of the double epitaxial layer so that when the aluminum is thereafter anodized, it will increase in volume by a factor of 1.5 so that the surface of the anodized aluminum is level with the surface of the epitaxial layer. During anodization, the substrate is submerged into an electrolyte containing any one of the following acids: sulfuric, phosphoric, oxalic, or chromic which electrolytes form a porous film of anodized aluminum. An anodizing potential is applied to the substrate in such a manner that the substrate and aluminum form an anode for anodizing the aluminum. The aluminum which was deposited on the oxide film is electrically isolated from the aluminum that is in contact with the P-type substrate and is therefore not anodized during the anodization process. The unanodized aluminum is thereafter removed using ferric chloride or a bromine compound.

Thus, the present invention eliminates two high temperature diffusion steps and one masking operation thereby reducing the cost of the integrated circuit device and reducing the degradation normally resulting from high temperature diffusion steps.

The base and emitter regions of the functional elements may be formed in the conventional manner either prior to or after forming the isolation regions.

In another embodiment it is contemplated that a layer of oxide will be formed prior to the evaporation of the aluminum to provide electrical isolation between the semiconductor material and the aluminum. In the embodiment, it is possible to partially anodize the aluminum thereby providing an electrical conductor of unanodized aluminum running throughout the circuit. This conductor may conveniently provide a ground bus for the integrated circuit.

The primary objective of the present invention is to provide a method for forming electrical isolation regions in semiconductor material.

Another objective of the present is to provide a process for forming electrical isolation regions between functional elements in an integrated circuit device.

Another objective of the present invention is to provide a semiconductor device that is less expensive and more reliable than those heretofore provided.

Another objective of the present invention is to provide a method for forming both an electrical isolation region between functional elements of an integrated circuit and a common ground bus for said circuit.

The foregoing and other objectives and advantages of the present invention will become more apparent from the following description and the accompanying drawings wherein one embodiment of the present invention is described.

DESCRIPTION OF THE PREFERRED EMBODIMENT

Figure 1:
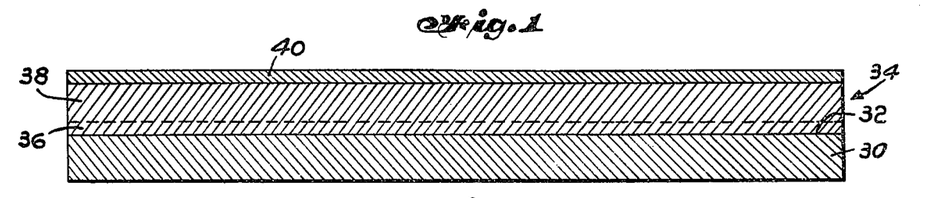
FIGS. 1 through 8 are cross-sectional views of a portion of an integrated circuit shown at various stages of fabrication in accordance with a first embodiment of the present invention.

Referring to FIG. 1, there is shown a substrate 30 formed of a standard slice of semiconductor material preferably silicon having P-type semiconductivity and a resistivity of approximately 1 ohm cm; however, it is to be understood that N-type semiconductivity material could also be used. The slice is polished to attain a mono-crystalline surface 32. On surface 32, there is grown an epitaxial layer 34 of N-type semiconductivity material. The epitaxial layer 34 should be grown so that it has a high N+ impurity concentration ajacent surface 32 and a graded N-type impurity concentration throughout the remainder of the layer. The variation in impurity concentration may be achieved by growing the layer with a graded impurity concentration varying from a high N+ concentration initially to a lower N concentration at the termination of the growth. Alternatively two distinct layers may be grown such as layer 36 having a high N+ impurity concentration and layer 38 having a standard N impurity concentration.

The epitaxial layer is grown using impurity atoms of phosphorous, arsenic, or antimony which provide for the N-type semiconductivity of the layer. Layer 36 has a higher impurity concentration and is formed during an epitaxial process at a temperature of approximately 1200° C and an impurity concentration equal to or greater than 2 times $10^{17}$ atoms per ccm. This growth is continued for approximately one minute to provide a layer having a thickness of approximately 1 micron. The growth is then continued with an impurity concentration of 1 times $10^{16}$ atoms per ccm for a period of approximately 7 minutes to form layer 38 having a thickness of approximately 6 to 7 microns. The above method provides for two distinct layers 36 and 38 having different impurity concentrations. If desired, a graded impurity concentration may be provided by growing the epitaxial layer for 1 minute with a concentration of 2 times $10^{17}$ impurity atoms per ccm and thereafter cutting off the impurity source while continuing the epitaxial growth. The residual impurity atoms form the graded concentration. The high N+ concentration in layer 36 provides a low saturation resistance allowing for high current density switching in the resulting semiconductor device.

The N-type conductivity layer 34 shown in FIG. 1 is preferably formed through the use of an epitaxial growth as previously described; however, for the purposes of the present invention, a diffusion step may be used to form the N+ layer 36 and thereafter layer 38 may be formed using a standard concentration epitaxial growth.

After forming the N-type conductivity layer 34, the semiconductive material is subjected to an oxidizing process so as to form a dielectric oxide layer 40 over the entire surface of the epitaxial layer.

While oxidizing the semiconductive material is the preferred method for providing the dielectric layer 40, the layer may be formed by deposition of silica nitride or an oxide that is both a dielectric and resistant to silicon etch.

Figure 2:
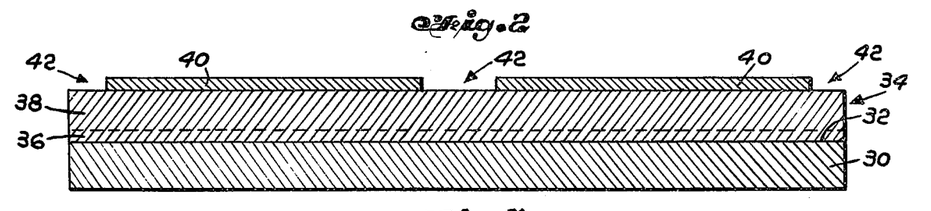

Using a conventional process, such as photo-resist, selected regions 42 of layer 40 are removed by etching. The remaining portions of layer 40 form a mask as shown in FIG. 2.

Figure 3:
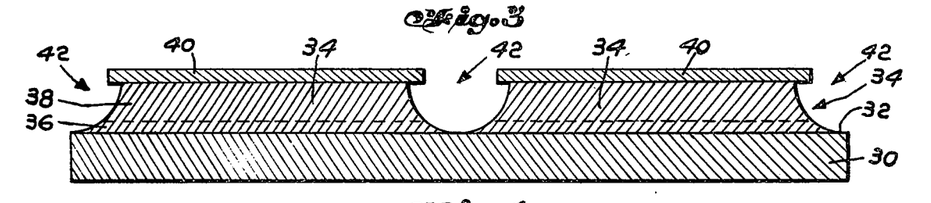

Using layer 40 as a mask, layer 34 is etched in regions 42 to completely remove the N-type semiconductivity material and to expose surface 32 of substrate 30 in regions 42 as shown in FIG. 3, thereby providing isolated portions of layer 34.

Figure 4:
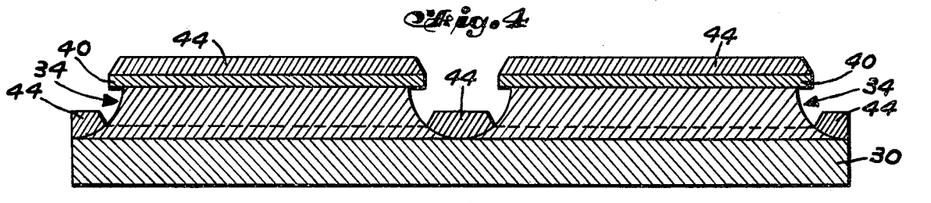

A metal, preferably aluminum, is evaporated onto the surfaces so as to form a conductive coating 44 on the oxide layer 40 and on the exposed regions 42 of substrate 30, as most clearly shown in FIG. 4. The metal deposited on regions 42 is in electrical contact with the P-type conductivity material of substrate 30; however, the metal deposited on the oxide layer 40 is electrically isolated from the substrate because of the dielectic properties of oxides such as silicon dioxide.

Figure 10:
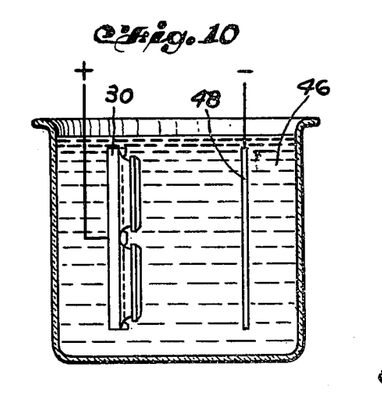
FIG. 10 is a diagramatic representation of one step in the process of the present invention.

The metal coating 44 deposited on the exposed regions 42 of substrate 30 is then selectively anodized to form a dielectric material for electrical isolation of the portions of layer 34 remaining. During the anodization process, the metal coating 44 in regions 42 forms an anode. This is accomplished by applying a positive potential directly to the metal coating is regions 42 or to the P-type conductivity material of substrate 30 while submerging the integrated circuit in an anodizying solution containing an electrolyte 46 and a cathode 48 as shown in FIG. 10.

In the fabrication of the embodiment being described, it is essential that regions 42 and the spaces between the isolated portions of layer 34 be entirely filled with a dielectric material; therefore, aluminum is the preferred metal since it can be entirely anodized.

In order to completely fill the spaces above regions 42, it is essential that a relatively thick, 7 to 8 microns, anodic film be established. A film of sufficient thickness may only be developed if the film is porous. To establish a porous anodic film an electrolyte must be selected so that it is of the type that dissolves the oxide of the metal at an appreciable rate so as to form pores. If the electrolyte does not have this characteristic, only a thin layer of the deposited metal will be anodized and pure metal will remain beneath the surface causing an electrical short between adjacent portions of N-type layer 34.

It has been determined that a porous anodic film may be formed from aluminum if any of the following electrolyte are used; sulfuric, phosphoric, oxalic or chromic acids. The concentration of the electrolyte solution may vary depending upon the thickness of the layer to be established and other design considerations. In the embodiment shown, where a film having a thickness of 7 to 8 microns is desired, a solution was formed containing 4,228 ml. of deionized water, 660 ml of sulfuric acid and 56 grams of oxalic acid. The solution was maintained at a temperature between 0° to 10° centigrade and a potential of 10 to 50 volts was applied across the electrodes as shown in FIG. 10 to provide an initial current density of 216 ma/in$^2$. It is preferable to apply a potential of slightly less than 10 volts; however, the applied potential will be dictated by design criteria.

Figure 5:
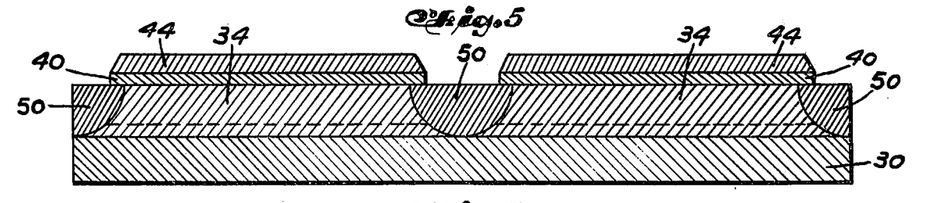

The potential is applied for a period of from 20 to 40 minutes or until the current density decreases to a level equal to approximately one-half the initial current density which indicates that essentially all of the aluminum has been anodized. After the aluminum has been completely anodized, its volume equals 1.5 times the original volume of aluminum; therefore, if the coating 44 of aluminum has a thickness equal to two-thirds the thickness of layer 34, the anodized aluminum 50 will appear as shown in FIG. 5 wherein regions 42 are completely filled. The aluminum coating 44 deposited on oxide layer 40 remains unanodized because it was electrically isolated from the substrate by the oxide layer 40.

The anodized aluminum is a dielectric and therefore provides complete electrical isolation between the isolated portions of layer 34 containing N-type conductivity material. The use of this type of dielectic material between N-type conductivity material completely eliminates the parasitic capacitance associated with the PN junction type of isolation used in the prior art.

Figure 6:
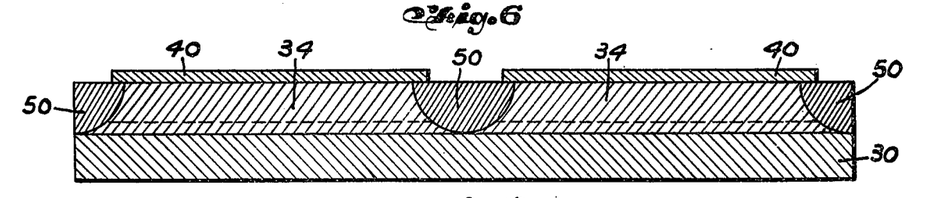

The unanodized aluminum on the oxide layer 40 may be removed using a compound that attacks the pure aluminum but does not have an effect on the anodized aluminum such as ferric chloride or a bromine compound. FIG. 6 shows the integrated circuit after the aluminum has been removed from the oxide layer, the circuit is in condition for the formation of base and emitter regions using standard diffusion techniques well-known in the semiconductor art.

Figure 7:
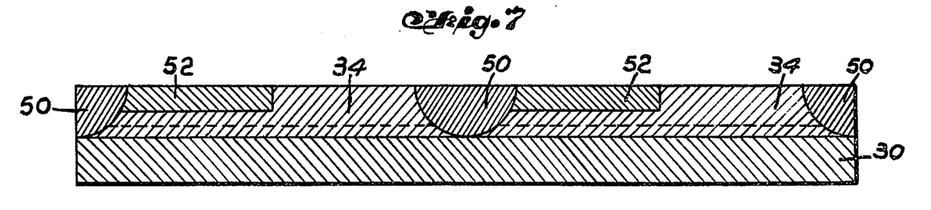
Figure 8:
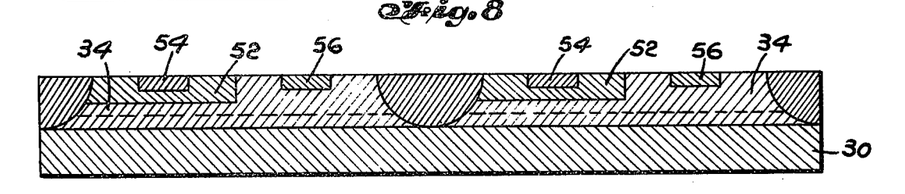

Referring to FIG. 7, the circuit is shown having a plurality of base regions 52 formed of P-type semiconductivity material. The base regions 52 are formed by using photo-resist process to etch the oxide layer to form an oxide mask defining regions 52. P-type impurities are then diffused into regions 52. The P-type impurities may be atoms of boron or any other well-known P-type impurity. After formation of the base regions 52, a photo-resist process is again used to form an oxide mask for defining regions to be diffused with N-type impurities to form N-type semiconductivity regions as shown in FIG. 8. N-type semiconductivity regions 54 function as emitter elements and regions 56 provide surfaces for ohmic collector contacts.

Figure 9:
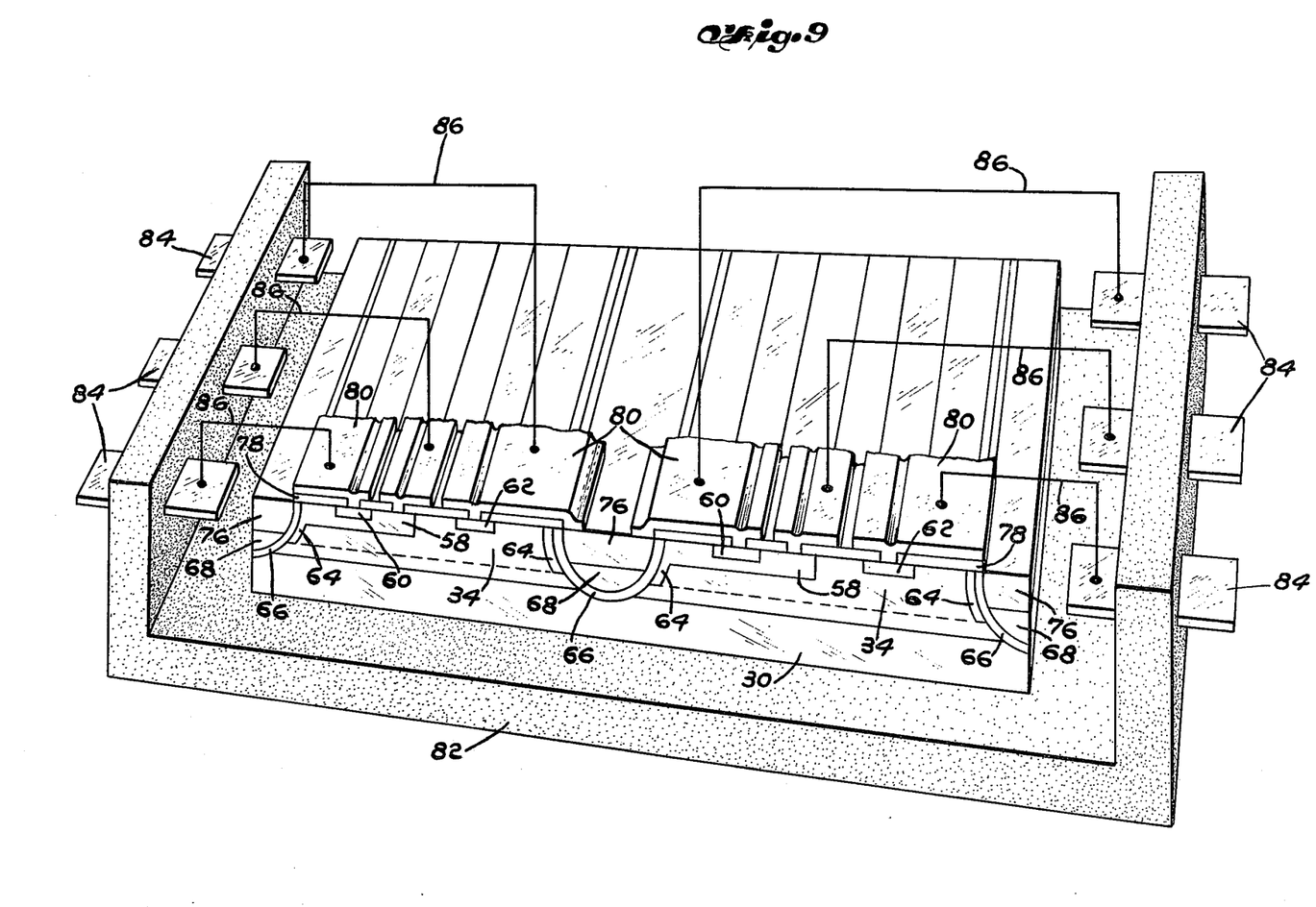
FIG. 9 is a cross-sectional view showing an encapsulated integrated circuit.

After formation of the base, emitter and ohmic contact regions, the circuit is in condition for testing and further processing which includes encapsulation into one of many types of available packages. Referring to FIG. 9, there is shown one example of an encapsulated integrated circuit.

It should be apparent to one skilled in the art that the process previously described may be somewhat varied while still practicing the inventive concepts. The P and N type semiconductivity regions may be switched to form a circuit having opposite type conductivity transistors. The base, emitter, and ohmic contact regions may be diffused into the epitaxial layer 34 prior to the formation of the isolation regions 42. One advantage of this procedure is that anodized aluminum has a tendency to shrink when exposed to temperatures in the realm of 1000° C; therefore, if the anodization step is deferred, the anodized aluminum will not be subjected to such extreme temperatures.

Figure 11:
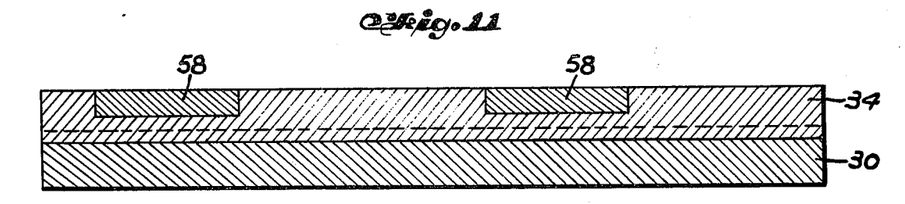
FIGS. 11 through 20 are cross-sectional views of a portion of an integrated circuit shown at various stages of fabrication in accordance with a second embodiment of the present invention.
Figure 12:
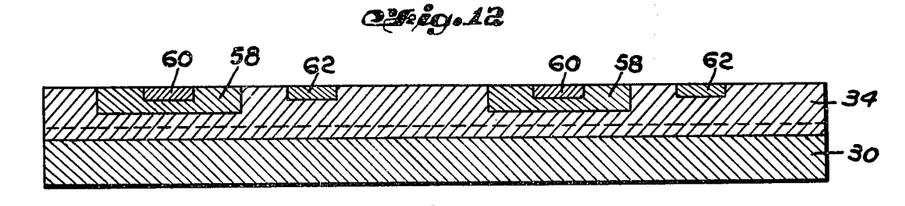
Figure 13:
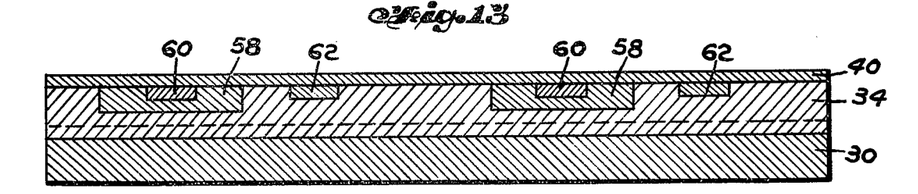
Figure 14:
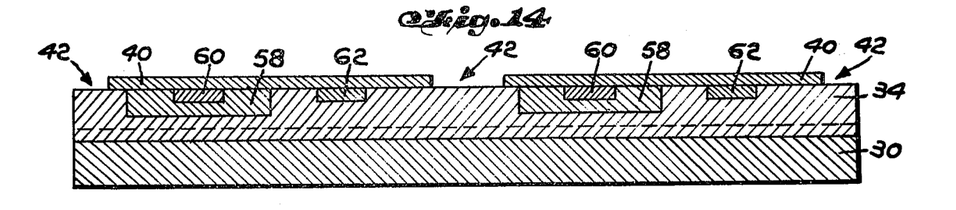

FIG. 11 shows a body of semiconductive material 30 of P-type semiconductivity with an N-type semiconductivity epitaxial layer 34 formed thereon in a manner similar to that described in FIG. 1. Two base regions 58 having P-type semiconductivity are formed by a P-type diffusion process. Photo-resist methods are used to develop an oxide mask to define the regions prior to diffusion. FIG. 12 shows the circuit of FIG. 11 after the formation of N-type semiconductivity regions 60 and 62 which form respectively emitter regions and ohmic collector contact regions for the circuit. Regions 60 and 62 are formed by an N-type diffusion process and photo-resist methods for oxide masking as previously described. A dielectric layer 40 is thereafter formed on the surface of the circuit as shown in FIG. 13. Regions 42 of layer 40 are removed using photo-resist techniques to form a mask from layer 40 as shown in FIG. 14.

Figure 15:
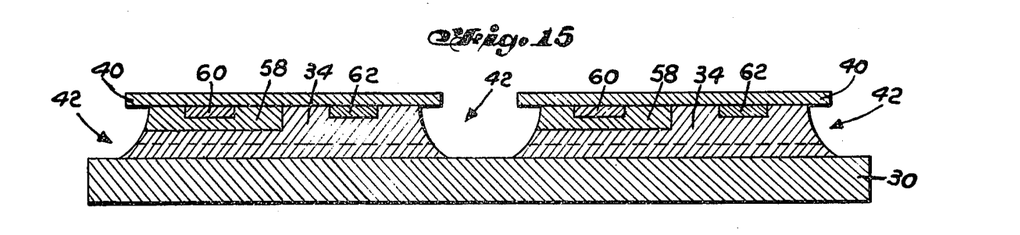

The N-type semiconductivity material exposed in region 42 is etched away to remove all the exposed N-type semiconductivity material and to expose the P-type substrate 30 in regions 42 as shown in FIG. 15 which is similar to FIG. 3 except that the base, emitter and ohmic contact regions are already formed.

The steps as described for and shown in FIGS. 4 through 6 including the evaporation of aluminum and the anodization thereof are used to fill the spaces above regions 42 with anodized aluminum which is a dielectric and provides electrical isolation between the portions of N-type conductivity material in layer 34.

Figure 16:
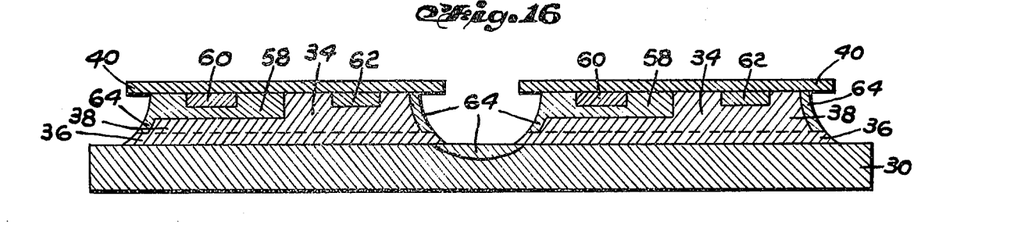

During fabrication of the circuit, it may be that N-type impurities become diffused into the P-type substrate 30. In order to overcome these impurities, it may be desirable to subject the circuit as shown in FIG. 15 to a short period of P-type impurity diffusion. The result of this diffusion is shown in FIG. 16, wherein a thin film 64 of P-type semiconductivity is formed about the side walls of the portions of N-type semiconductivity material in sublayer 38 of layer 34 and layer 30 but not about the N+ sublayer 36 because the P-type impurities diffused into the semiconductive material are not sufficient to overcome the N+ impurities contained therein sublayer 36.

Figure 17:
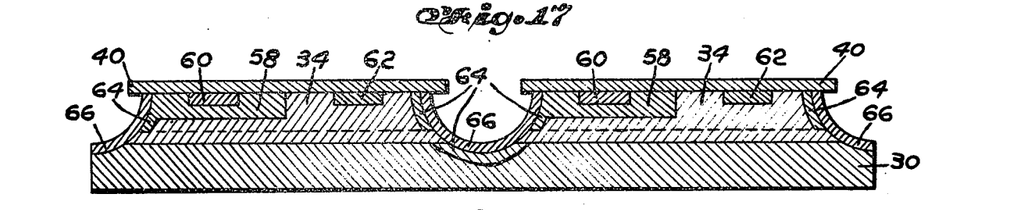
Figure 18:
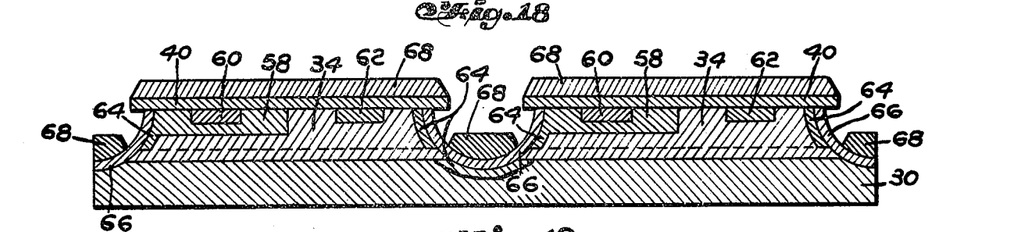

In certain applications, it may be desirable to provide a ground bus or a continuous electrical conductor that runs throughout the entire integrated circuit. If such is the case, the aluminum or in the case other conductive metal can be partially anodized leaving a metal conductor below the anodic layer; however, the metal conductor would then provide an electrical short between adjacent portions of layer 34. In order to overcome this problem, a short oxidation step is performed prior to the formation of the metal coating. The oxidation step provides a layer 66 of oxide such as silicon dioxide over the entire surface of the circuit. The oxide is a dielectric material and provides the necessary electrical isolation between the portions of layer 34 as shown in FIG. 17. After the formation of the oxide layer 66, a metal layer 68 may be evaporated onto the circuit as shown in FIG. 18.

Figure 21:
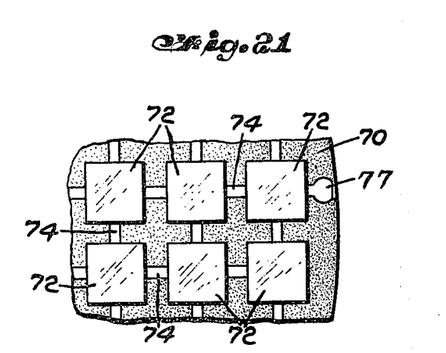
FIG. 21 is a plan view of a portion of a slice of semiconductive material having a plurality of integrated circuit elements formed thereon with an interconnecting ground bus.

Since the oxide layer 66 isolates the metal 68 from the P-type semiconductive substrate 30, the anodizing potential must be applied directly to the metal rather than through the substrate as in the previous embodiment. Referring to FIG. 21, there is shown a slice of semiconductive material 70 having a plurality of integrated circuit devices 72 formed thereon with channels 74 of metal interconnecting each of said devices. Channels 74 are merely extentions of regions 42 with metal 68. A single contact point 77 is provided for applying the anodizing potential to all the circuit on the slice 70.

Figure 19:
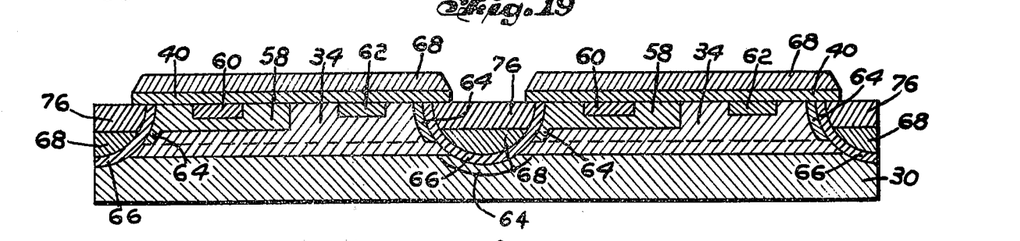
Figure 20:
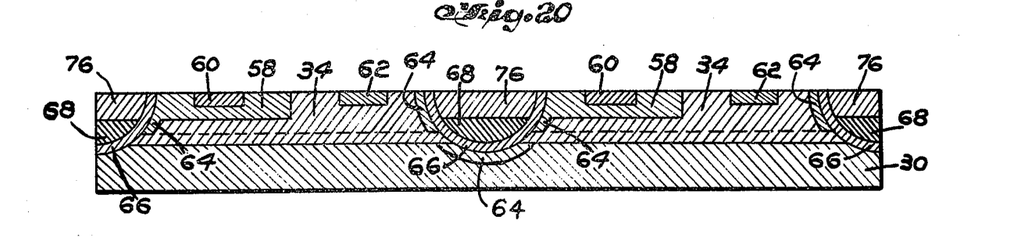

The metal 68 is then partially anodized as prviously described so as to form an anodic layer 76 shown in FIG. 19. A portion of the metal 68 remains unanodized and provides an electrical conductor running through the entire integrated circuit for providing a ground bus if so desired. The metal 68 deposited on oxide layer 40 can be removed in a manner similar to that previously described so as to provide an integrated circuit substantially as shown in FIG. 20. The circuit shown in FIG. 20 is then encapsulated in a package as shown in FIG. 9.

FIG. 9 shows a typical encapsulated integrated circuit. The integrated circuit as shown in FIGS. 8 and 20 must be provided with base, emitter and collector contacts. When forming these contacts an oxide layer 78 is formed over the device and selected portions are removed over the desired contact points. Using aluminum metallization, an aluminum layer 80 is evaporated over the entire device so as to make contact with the exposed semiconductive material at the contact points. The aluminum is removed from undesired areas using a photo resist process so that the contacts may be isolated from each other.

The integrated circuit is then mounted on the base of a package 82 which is usually formed of a glass like material depending on the requirements of the device. The package has contact leads 84 extending therethrough to which the contact points of layer 80 are connected by fine wire bonds 86. The package is then closed using any of a number of well known techniques.

Thus, the present invention provides a method for forming isolation regions in semiconductor material using an anodized metal. When the process is used, in the fabrication of integrated cricuits, high temperature diffusion steps are eliminated along with a masking operation. The use of a dielectric material as an insulator between active elements in an integrated circuit provides advantages over the prior art in particular it eliminates the problems encountered with the parasitic capacitance associated with the PN junctions used for isolation in the prior art. Thus, the present invention provides for less expensive integrated circuits having improved operating characteristics.

What is claimed is:

1. A method for providing electrical isolation regions in a semiconductive material, comprising the steps of:
    forming a protective dielectric layer on a surface of the semiconductive material;
    removing the dielectric and a portion of the semiconductive material in said regions;
    depositing a metal over said surface to cover both the regions and the dielectric layer, said metal having a thickness so that the metal on the dielectric layer does not contact the metal in the regions;
    anodizing the metal in the regions by submerging the semiconductive material into an anodizing solution and applying and anodizing potential to the metal in the regions so that the metal in the regions becomes an anode and is anodized to form a dielectric insulating material in the regions, the metal on the dielectric layer remaining unanodized because of the electrical insulation provided by the dielectric layer which separates the metal from the semiconductive material; and
    removing the unanodized metal from the dielectric layer by etching in a solution that does not attack the anodized metal.

2. A method as described in claim 1, wherein the metal is aluminum and the anodizing solution is selected from a group including sulfuric, phosphoric, oxalic and chromic acid solutions.

3. A method as described in claim 1, wherein the metal is aluminum and the unanodized aluminum is removed by etching with a solution selected from a group including Ferric Chloride and bromine.

4. A method as described in claim 1, wherein the semiconductive material comprises a substrate layer of a first semiconductivity type material and another layer formed thereon of a second semiconductivity type material, said removing of a portion of the semiconductive material being accomplished by etching with an etch that attacks the semiconductive material more readily than the dielectric layer, said etching being continued until all of the second semiconductivity type material in the regions is removed to expose the substrate.

5. A method as described in claim 4, wherein the metal is deposited in the etched regions to a depth sufficient so that the anodized metal will fill the etched region when completely anodized.

6. A method as described in claim 4, wherein the metal is aluminum which is deposited to a thickness equal to approximately two thirds the thickness of the second conductivity type material.

7. A method as described in claim 1, additionally comprising the step of oxidizing the semiconductive material after removing portion of the semiconductive material to form a non-conducting oxide layer over the entire surface of the semiconductive material prior to depositing the metal coating.

8. A method as described in claim 7, wherein the metal is only partially anodized so as to form a layer of anodized metal in the regions.

9. A method as described in claim 7, wherein the metal is deposited to a depth so that partially anodized metal and unanodized metal will fill the region.

10. A method as described in claim 7, wherein the semiconductive material comprises a substrate layer of a first semiconductivity type material and another layer formed thereon of a second semiconductivity type material, wherein all of the second semiconductivity type material in the regions is removed to expose the substrate.

11. A method as described in claim 10, wherein the metal is deposited to a depth sufficient so that the anodized metal will fill the region when completely anodized.

12. A method as described in claim 10, wherein the metal is aluminum which is deposited to have a thickness equal to approximately two thirds the thickness of the second conductivity type material.

13. A method of fabricating a semiconductor device comprising the steps of:
forming on the surface of a body of semiconductive material of a first semiconductivity type a layer of second semiconductivity type material, said layer having a high concentration of impurities on a side adjacent the body and a lower concentration on a side opposite said body;
forming a protective dielectric layer on said layer of second semiconductivity type material;
removing said dielectric and said layer of second semiconductivity type material from selected regions;
depositing a metal over said device so that the metal is deposited on the dielectric layer and in the selected regions, the metal in the regions being isolated from the metal on the dielectric layer;
anodizing at least a portion of the metal deposited in the selected regions by submerging said device in an anodizing solution and applying an anodizing potential to the metal in the regions in such a manner that the metal in the regions become an anode, said anodized metal forming a dielectric insulation in the regions, the metal deposited on the dielectric layer remaining unanodized because of the electrical insulation characteristic of the dielectric layer;
removing said device from the anodizing solution;
removing the unanodized metal by submerging in a solution that etches the pure metal but not the anodized metal;
forming regions of first semiconductivity type material in the layer of second semiconductivity type material; and
forming zones of second type semiconductivity material in said regions of first type semiconductivity material.

14. A method as described in claim 13, additionally comprising the step of:
encapsulating said body and providing electrical connections to desired portions thereof.

15. A method as described in claim 13, wherein the step of forming a layer of second semiconductivity type material comprises the steps of forming a first layer of second semiconductivity type material having a high concentration of impurities and forming a second layer of second semiconductivity type material having a lower concentration of impurities.

16. A method as described in claim 13, wherein the step of forming a layer of second semiconductivity type material comprises the step of growing an epitaxial layer of second semiconductivity type material in such a manner as to provide a varying concentration of impurites from a high concentration adjacent the body to a lower concentration at an opposite side remote from said body.

17. A method as described in claim 13, wherein the metal is aluminum which is deposited to have a thickness equal to approximately two thirds the thickness of the layer of second semiconductivity type material.

18. A method as described in claim 13, additionally comprising the step of oxidizing said semiconductive material to form a layer of oxide on the surface of said regions after the dielectric and layer of second semiconductivity type material is removed from the selected regions.

19. A method as described in claim 18, wherein the metal is aluminum and all of the aluminum is anodized.

20. A method as described in claim 18, wherein only a top layer of said metal is anodized so that the unanodized metal provides a conductor.

21. A method as described in claim 18, additionally comprising the step of diffusing over the surface of said selected etched regions a first type of semiconductive impurity to form a film of first type of semiconductive material over the surface of the second type of semiconductive material having the lower impurity concentration prior to oxidizing.

22. A method as described in claim 21, wherein the metal is aluminum and is deposited on said body to have a thickness equal to approximately two thirds the thickness of the layer of second semiconductivity type material.

23. A method as described in claim 21, wherein the steps of forming a first layer of second semiconductivity type material comprises the steps of forming a first layer of second semiconductivity type material having a high concentration of impurities and forming a second layer of second semiconductivity type material having a lower concentration of impurities.

24. A method as described in claim 21, wherein the step of forming a layer of second semiconductivity type material comprises the step of growing an epitaxial layer of semiconductive material of the second semiconductivity type in such a manner as to provide a varying concentration of impurities from a high concentration adjacent the body to a lower concentration at an opposite side remote from said body.

25. A method as described in claim 21, additionally comprising the step of encapsulating said body and providing electrical connections to desired portions thereof.

26. A method of fabricating a semiconductor device comprising the steps of:
forming on the surface of a body of semiconductive material of a first semiconductivity type a layer of second semiconductivity type material, said layer having a high concentration of impurities on a side adjacent the body and a lower concentration on a side opposite said body;
forming regions of first semiconductivity type material in the layer of second semiconductivity type material;

forming zones of first type semiconductivity material in said regions of first type semiconductivity material;

forming a dielectric protective layer on said layer of second semiconductivity type material;

removing the dielectric and said layer of second semiconductivity type material in selected regions;

depositing a layer of metal on the surface of said device so that the metal is deposited in the selected regions and on the dielectric layer, the metal in the regions being isolated from the metal on the dielectric layer;

anodizing the metal deposited in the selected regions by submerging said body in an anodizing solution and applying an anodizing potential to said body and said solution in such a manner that the metal in the regions becomes an anode and forms a dielectric insulation in the regions;

removing said body from the anodizing solution; and removing the unanodized metal by submerging in a solution that etches the metal but not the anodized metal.

27. A method as described in claim 26, additionally comprising the step of encapsulating said body and providing electrical connections to desired portions thereof.

28. A method as described in claim 26, wherein the step of forming a layer of second semiconductivity type material comprises the steps of forming a first layer of second semiconductivity type material having a high concentration of impurities and forming a second layer of second semiconductivity type material having a lower concentration of impurities.

29. A method as described in claim 26, wherein the step of forming a layer of second semiconductivity type material comprises the step of depositing an epitaxial layer of semiconductive material of the second semiconductivity type in such a manner as to provide a varying concentration of impurities from a high concentration adjacent the body to a lower concentration at an opposite side remote from said body.

30. A method as described in claim 26, additionally comprising the step of oxidizing said semiconductive material to form a layer of oxide over the surface of said regions after the dielectric and said layer of second semiconductivity type material is removed from said selected regions.

31. A method as described in claim 30, wherein the metal is aluminum which is all anodized.

32. A method as described in claim 30, wherein only a top layer of said metal is anodized so that the unanodized metal provides a conductor.

33. A method as described in claim 30, additionally comprising the step of diffusing a first type of semiconductive impurity into the etched regions to form a film of first type of semiconductive material over the surface of said second semiconductivity type material having a lower impurity concentration.

34. A method as described in claim 33, wherein the metal is aluminum and is deposited on said body to have a thickness equal to approximately two thirds the thickness of the layer of second semiconductivity type material.

35. A method as described in claim 33, wherien the step of forming a layer of second conductivity type material comprises the steps of forming a first layer of second semiconductivity type material having a high concentration of impurities and forming a second layer of second semiconductivity type material having a lower concentration of impurities.

36. A method as described in claim 33, wherein the step of forming a layer of second semiconductivity type material comprises the step of growing an epitaxial layer of semiconductive material of the second semiconductivity type in such a manner as to provide a varying concentration of impurities from a high concentration adjacent the body to a lower concentration at an opposite side remote from said body.

37. A method as described in claim 33, additionally comprising the step of encapsulating said body and providing electrical connections to desired portions thereof.

* * * * *